United States Patent [19]

Miyake et al.

[11] Patent Number: 4,475,048
[45] Date of Patent: Oct. 2, 1984

[54] IGFET SCHMITT CIRCUIT

[75] Inventors: Shinichi Miyake; Tomio Yanagidaira; Akio Murayama, all of Gunma, Japan

[73] Assignee: Sanyo Electric Co., Ltd., Tokyo, Japan

[21] Appl. No.: 373,603

[22] Filed: Apr. 30, 1982

[30] Foreign Application Priority Data

May 2, 1981 [JP] Japan ................................ 56-67454

[51] Int. Cl.³ .................... H03K 3/356; H03K 17/10; H03K 17/687; H03K 19/20
[52] U.S. Cl. .................................. 307/279; 307/290; 307/448; 307/579
[58] Field of Search ............... 307/279, 290, 448, 450, 307/451, 576, 579, 584, 585

[56] References Cited

U.S. PATENT DOCUMENTS

| | | | |
|---|---|---|---|
| 3,873,856 | 3/1975 | Gerlach et al. | 307/279 |
| 4,000,427 | 12/1976 | Hoffman | 307/290 X |
| 4,071,784 | 1/1978 | Maeder et al. | 307/279 |
| 4,242,604 | 12/1980 | Smith | 307/290 X |
| 4,295,062 | 10/1981 | Mihalich et al. | 307/279 |
| 4,297,596 | 10/1981 | Eckert | 307/290 X |
| 4,379,974 | 4/1983 | Plachno | 307/290 X |

Primary Examiner—Stanley D. Miller
Assistant Examiner—David R. Hudspeth
Attorney, Agent, or Firm—Darby & Darby

[57] ABSTRACT

A Schmidt circuit comprises a first series circuit including an impedance device and a series connection of a first and second MOS field effect transistors, and a second series circuit including a series connection of a third and fourth MOS field effect transistors. The first series circuit is connected between a voltage supply and the ground and the second series circuit is connected between the voltage supply and the junction of the first and second MOS field effect transistors. The gates, as commonly connected, of the first and second MOS field effect transistors are supplied with an input voltage, and the junction of the impedance device and the first MOS field effect transistor is connected to the gate of the third MOS field effect transistor, so that an output voltage is withdrawn therefrom.

5 Claims, 7 Drawing Figures

IGFET SCHMITT CIRCUIT

BACKGROUND OF THE INVENTION

1. Field of the Invention

The present invention relates to a Schmitt circuit implemented using insulated gate field effect transistors, referred to as MOS transistors in the present application, and more specifically to a Schmitt circuit capable of maintaining with accuracy a threshold voltage thereof.

2. Description of the Prior Art

Conventionally a Schmitt circuit was integrated in an integrated circuit such as a large scale integration in the manner as shown in FIG. 1.

The Schmitt circuit shown in FIG. 1 comprises a series connection of a first, second and third MOS transistors 1', 2' and 3' interposed between a voltage source $V_{DD}$ and the ground, and a fourth MOS transistor 4' coupled between the voltage source $V_{DD}$ and the junction of the second and third MOS transistors 2' and 3'. The drain and the gate of the first MOS transistor 1' are connected to the voltage source $V_{DD}$5 so that the first MOS transistor 1' functions as a so-called load MOS transistor, while the source of the first MOS transistor 1' is connected to the drain of the second MOS transistor 2' and the gate of the fourth MOS transistor 4', where an output voltage $V_{OUT}$ is withdrawn. On the other hand, the input voltage $V_{IN}$ is applied to the gates of the second and third MOS transistors 2' and 3' and the junction of the source of the second MOS transistor 2' and the drain of the third MOS transistor 3' is connected to the source of the fourth MOS transistor 4'. The MOS transistors 1', 2' and 3' and 4' may be N-channel MOS transistors formed on the same pellet.

Now an operation of the Schmitt circuit shown in FIG. 1 will be described with reference to FIG. 2. FIG. 2 is a graph showing a relation between the input voltage $V_{IN}$ in the abscissa and the voltages at the respective portions in the ordinate. In the graph, Vt1, Vt2, Vt3 and Vt4 denote threshold voltages of the MOS transistors 1', 2', 3' and 4', and $\Delta$Vt1, $\Delta$Vt2 and $\Delta$Vt4 denote backgate bias voltages of the first, second and fourth MOS transistors 1', 2' and 4'. In general, the region where the channels of MOS transistors are formed, i.e. the substrate is connected to the ground and a backgate bias voltage is applied by the voltage developed between the substrate and the source.

When the input voltage $V_{IN}$ is zero volt, the second and the third MOS transistors 2' and 3' are turned off, while when the source voltage V1 of the first MOS transistor 1' is lower than $V_{DD}-(Vt1+\Delta Vt1)$ the first MOS transistor 1' is turned on, thereby to raise the voltage V1 to the $V_{DD}-(Vt1+\Delta Vt1)$. Accordingly, the gate of the fourth MOS transistor 4' is supplied with the voltage V1 of the $V_{DD}-(Vt1+\Delta Vt1)$. On the other hand, when the source voltage V2 of the fourth MOS transistor 4' is lower than $V1-(Vt4+\Delta Vt4)$, i.e. $V_{DD}-(Vt1+\Delta Vt1)-(Vt4+\Delta Vt4)$, the fourth MOS transistor 4' is turned on, thereby to raise the voltage V2 to $V_{DD}-(Vt1+\Delta Vt1)-(Vt4+\Delta Vt4)$. More specifically, when the input voltage $V_{IN}$ is zero volt, the relations of $V1=V_{DD}-(Vt1+\Delta Vt1)$, $V2=(V_{DD}-(Vt1+\Delta Vt1)-(Vt4+\Delta Vt4)$ are established.

When the input voltage $V_{IN}$ increases and exceeds the threshold voltage Vt3 of the third MOS transistor 3', the third MOS transistor 3' starts turning on, whereby a current flows through the fourth MOS transistor 4'. Normally the third and fourth MOS transistors 3' and 4' are fabricated in the same size. In such a case, as the input voltage $V_{IN}$ increases the voltage V2 decreases along an auxiliary line (a) having the angle of 45° with respect to the abscissa from the voltage of $V_{DD}-(Vt1+\Delta Vt1)-(Vt4+\Delta Vt4)$. When the difference between the input voltage $V_{IN}$ and the voltage V2 coincides with $Vt2+\Delta Vt2$, i.e. when the auxiliary lines (a) and (b) intersects each other, the second MOS transistor 2' is turned on and the voltage V1 decreases. Therefore, the voltage V2 also decreases and the voltage between the gate and the source of the second MOS transistor 2' increases, whereby the voltage V1 further decreases due to a feedback function, with the result that the voltages V1 and V2 abruptly fall to the vicinity of the ground level, whereby it is supposed that the fourth MOS transistor 4' is turned off. However, the backgate bias voltages $\Delta$Vt2 and $\Delta$Vt4 decrease by dVt due to the fact that the source voltage V2 decreases. Accordingly, in actuality the voltage V2 changes along a locus of the gradient smaller than 45° with respect to the abscissa, while the voltage obtained by substracting $(Vt2+\Delta Vt2)$ from the input voltage $V_{IN}$, i.e. $V_{IN}-(Vt2+\Delta Vt2)$ falls as shown by an auxiliary line (c) having the angle more than 45° with respect to the abscissa starting from the time point when the input voltage $V_{IN}$ becomes equal to Vt3. The input voltage $V_{IN}$ when the voltage V2 and the auxiliary line (c) intersect each other becomes the threshold voltage $V_{TH}$ of the Schmitt circuit, the voltage $V_{TH}$ being also consistent with the auxiliary lines (a) and (b). The reason is that since the source voltage V2 of the second and fourth MOS transistors 2' and 4' is common the difference dVt of the backgate bias voltages $\Delta$Vt2 and $\Delta$Vt4 is offset, whereby no influence is caused to the threshold voltage $V_{TH}$ of the Schmitt circuit.

In the case where the input voltage $V_{IN}$ falls from a sufficiently high voltage, when the potential difference between the input voltage $V_{IN}$ and the voltage V2 becomes smaller than the sum $\{Vt2+\Delta Vt2(V2)\}$ of the threshold voltage Vt2 of the MOS transistor 2' and the backgate bias voltage $\Delta Vt2(V2)$ at the voltage V2 at that time, i.e. when the auxiliary line (c) and the voltage V2 intersect each other, the second MOS transistor 2' is turned off and the voltage V1 returns to the initial voltage $V_{DD}-(Vt1+\Delta Vt1)$ and at the same time the fourth MOS transistor 4' is again turned on, whereby the voltage V2 changes along the predetermined locus. When the input voltage $V_{IN}$ becomes smaller than the threshold voltage Vt3 of the third MOS transistor 3', the MOS transistor 3' is turned off and the voltage V2 returns to the initial voltage $V_{DD}-(Vt1+\Delta Vt1)-(Vt4+\Delta Vt4)$.

Referring to FIG. 2, if the auxiliary lines (d) and (e) are drawn at the angle of 45° with respect to the abscissa from the intersection of the locus of the voltage V2 and the auxiliary line (c), a half of the voltage between the points where these intersect the ordinate becomes the threshold voltage $V_{TH}$ of the Schmitt circuit. More specifically, the threshold voltage $V_{TH}$ of the Schmitt circuit may be expressed by the following equation.

$$V_{TH} = \frac{V_{DD} - (Vt1 + \Delta Vt1) - (Vt4 + \Delta Vt4) + dVt + Vt3}{2} +$$

$$\frac{(Vt2 + \Delta Vt2) - dVt}{2}$$

Since the MOS transistors 1', 2', 3' and 4' are all formed on the same chip, the threshold voltages Vt1, Vt2, Vt3 and Vt4 of the MOS transistors become equal to each other, while the backgate bias voltages ΔVt2 and ΔVt4 are also equal to each other because the sources thereof are common. Accordingly, the threshold voltage $V_{TH}$ of the Schmitt circuit may be expressed by the following equation.

$$V_{TH} = \frac{V_{DD}}{2} - \frac{\Delta Vt1}{2}$$

As is clear from the foregoing equation, the threshold voltage $V_{TH}$ of the Schmitt circuit becomes smaller than a half of the source voltage $V_{DD}$ by a half of the backgate bias voltage ΔVt1 of the first MOS transistor 1', resulting in the shortcoming that accurate regulation to the source voltage $V_{DD}$ can not be achieved. Furthermore a further shortcoming was involved that in the case where the input voltage $V_{IN}$ remains zero volt for a long period of time, the point of the voltage V1 becomes a floating state and the first MOS transistor 1' enters in the off region due to an ordinary noise and a leak current, whereby the voltage V1 becomes higher than $V_{DD}-(Vt1+\Delta Vt1)$ and becomes unstable, while the voltage V2 also becomes higher than $V_{DD}-(Vt1+\Delta Vt1)-(Vt4+\Delta Vt4)$, with the result that the threshold voltage $V_{TH}$ of the Schmitt circuit becomes unstable.

SUMMARY OF THE INVENTION

The present invention was made in the light of the above described shortcomings and aims to provide a Schmitt circuit for accurate restriction of the threshold voltage.

Briefly described, the present invention comprises a Schmitt circuit including a first and second potentials, an impedance device, a first insulated gate field effect transistor and a second insulated gate field effect transistor connected in series between these potentials, and a third and fourth insulated gate field effect transistors connected in series between the first potential and the junction between the first and second insulated gate field effect transistors, an input voltage being applied to the gates of the first and second insulated gate field effect transistors, the junction of the impedance device and the first insulated gate field effect transistor being connected to the gate of the third insulated gate field effect transistor, an output voltage being withdrawn therefrom.

According to the present invention, the provision of the impedance device eliminates a floating state of the output, thereby to achieve stabilization of threshold voltage of the Schmitt circuit. Furthermore, the output voltage is fully swung from the source voltage to the ground level, whereby the inventive Schmitt circuit can be utilized effectively even in the case of a low source voltage.

In a preferred embodiment of the present invention, the substrate of the first, second and fourth insulated gate field effect transistors is connected to the second potential and the substrate of the third insulated gate field effect transistor is connected to the source thereof. In the preferred embodiment now in description, connection of the substrate of the third insulated gate field effect transistor to the source eliminates any influence caused by the backgate bias voltage upon the threshold voltage of the Schmitt circuit, thereby to enable setting of the threshold voltage to a half of the source voltage with accuracy.

Accordingly, a further object of the present invention is to provide a Schmitt circuit which enables accurate setting of the threshold voltage to a half of the source voltage.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
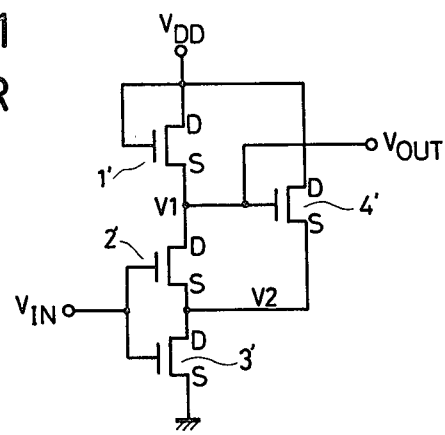
FIG. 1 is a schematic diagram of a conventional example.
Figure 2:
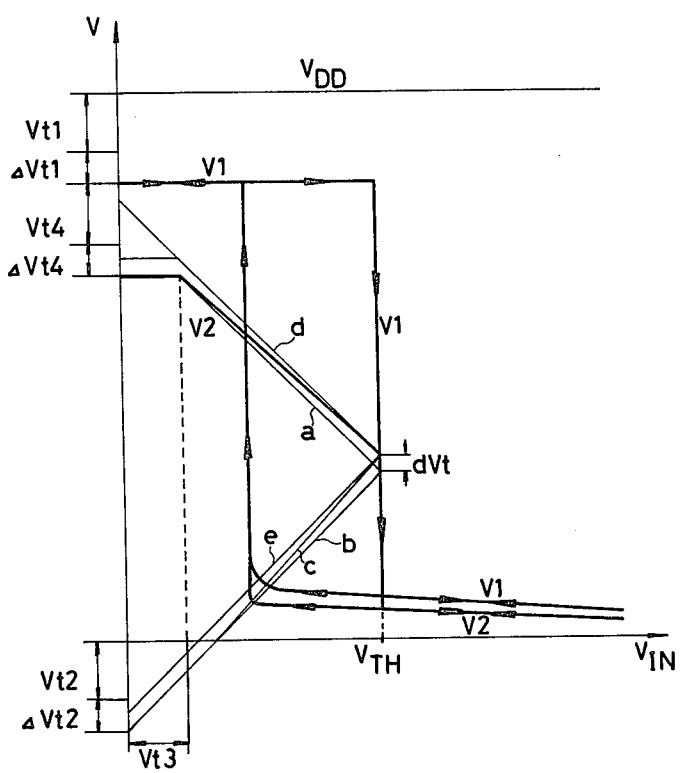
FIG. 2 is a graph for depicting the operation of the FIG. 1 example.
Figure 3:
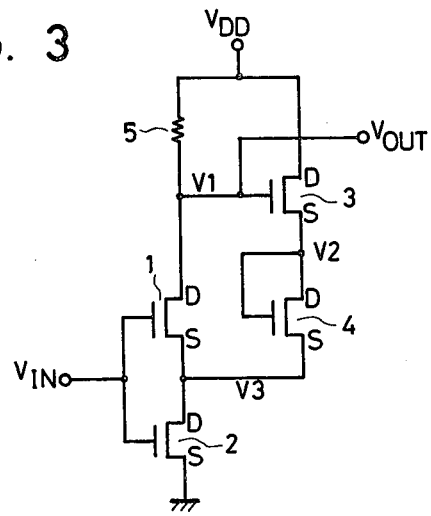
FIG. 3 is a schematic diagram of one embodiment of the present invention.

FIG. 3 is a schematic diagram of one embodiment of the present invention. The reference numeral 5 denotes an impedance device. The reference numerals 1, 2, 3 and 4 denote a first, second, third and fourth MOS transistors of an N-channel (or P-channel) type, which are all formed on the same pellet. The impedance device 5, and the first and second MOS transistors 1 and 2 are series connected between the voltage source $V_{DD}$ and the ground, while the gates of the first and second MOS transistors 1 and 2 are supplied with the input voltage $V_{IN}$. Furthermore, the third and fourth MOS transistors 3 and 4 are series connected between the voltage source $V_{DD}$ and the junction (the voltage V3) of the first and second MOS transistors 1 and 2, while the gate of the third MOS transistor 3 is connected to the junction (the voltage V1) of the impedance device 5 and the drain of the first MOS transistor 1 and the gate of the fourth MOS transistor 4 is connected to the drain (the voltage V2) thereof. The impedances of the second, third and fourth MOS transistors 2, 3 and 4 in an on-state has been selected to be 2:1:1 for the purpose of setting the threshold voltage $V_{TH}$ of the Schmitt circuit to a half of the source voltage $V_{DD}$. Since the gate width is proportional to a square of the reciprocal of the impedance in a saturated region, the ratio of the gate width of each of the MOS transistors 2, 3 and 4 becomes 1:4:4. More specifically, the gate widths of the third and fourth MOS transistors 3 and 4 are selected to be four times that of the second MOS transistor 2 in the case of the same channel length.

Figure 4:
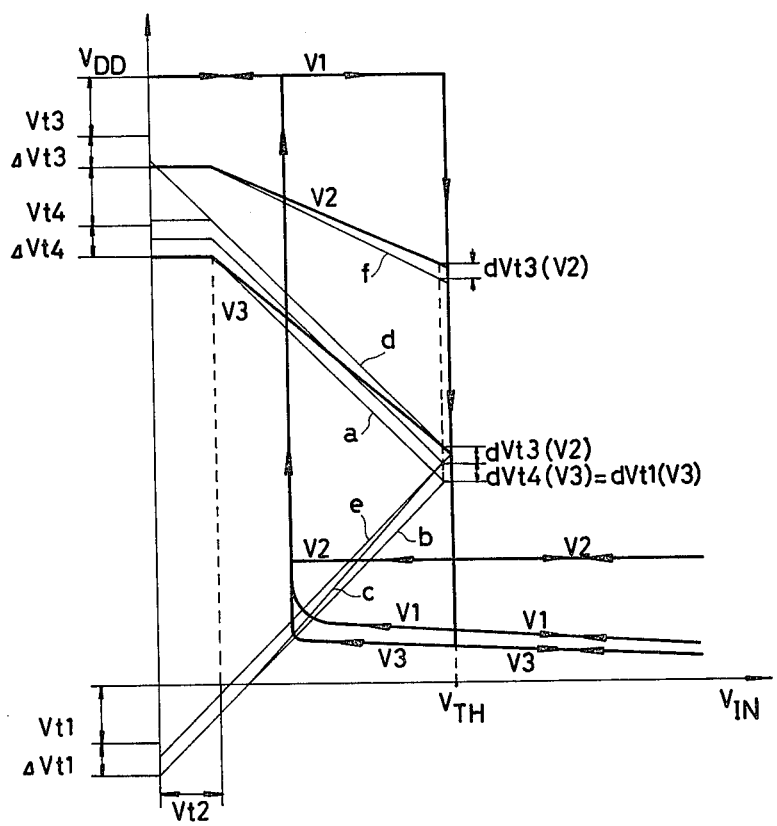
FIG. 4 is a graph for depicting the operation of the FIG. 3 embodiment.

Now an operation of the Schmitt circuit shown in FIG. 3 will be described with reference to FIG. 4. FIG. 4 is a graph showing a relation between the input voltage $V_{IN}$ in the abscissa and the voltages at the respective portions in the ordinate. In the graph, Vt1, Vt2, Vt3 and Vt4 denote the threshold voltages of the first, third and fourth MOS transistors 1, 3 and 4 and ΔVt1, ΔVt3 and ΔVt4 denote the backgate bias voltages developed due to the source-substrate voltages of the first, third and fourth MOS transistors 1, 3 and 4.

When the input voltage $V_{IN}$ is zero volt, both the first and second MOS transistors 1 and 2 are turned off and the source voltage $V_{DD}$ appears as the voltage V1. When the voltage V2 is lower than V1−(Vt3+ΔVt3), i.e. $V_{DD}$−(Vt3+ΔVt3) in such a state, the third MOS transistor 3 is turned on and the source voltage V2 of the second MOS transistor 2 is raised up to $V_{DD}$−(Vt3+ΔVt3). If the voltage V3 is lower than V2−(Vt4+ΔVt4), i.e. $V_{DD}$−(Vt3+ΔVt3)−(Vt4+ΔVt4), the fourth MOS transistor 4 is turned on, thereby to raise the source voltage V3 of the third MOS transistor 3 up to $V_{DD}$−(Vt3+ΔVt3)−(Vt4+ΔVt4). More specifically, while the input voltage $V_{IN}$ falls between zero volt to Vt2, the relations V1=$V_{DD}$, V2=$V_{DD}$−(Vt3+ΔVt3), V3=$V_{DD}$−(Vt3+ΔVt3)−(Vt4+ΔVt4) are established.

When the input voltage $V_{IN}$ exceeds the threshold voltage Vt2 of the second MOS transistor 2, the second MOS transistor 2 starts turning on and a current flows through the third and fourth MOS transistors 3 and 4. Since the ratio of the impedances when the second, third and fourth MOS transistors 2, 3 and 4 are in the on-state is 2:1:1, the voltage V3 falls along the auxiliary line (a) at the angle of 45° with respect to the abscissa. When the difference between the input voltage $V_{IN}$ and the voltage V3 become Vt1+ΔVt1, i.e. when the auxiliary line (b) showing the voltage $V_{IN}$−(Vt1+ΔVt1) obtained by subtracting Vt1+ΔVt1 from the input voltage $V_{IN}$ intersects the auxiliary line (a), it is supposed that the first MOS transistor 1 is turned on. On the other hand, it is further supposed that the voltage V2 falls along the auxiliary line (f) at a fall amount of a half of the fall amount of the auxiliary line (a). In actuality, the backgate bias voltage ΔVt3 of the third MOS transistor 3 decreases by dVt3(V2) and the backgate bias voltages ΔVt1 and ΔVt4 of the first and fourth MOS transistors 1 and 4 decrease by dVt4(V3) and accordingly the voltage V2 increases by dVt3(V2) as compared with the auxiliary line (f), while the voltage V3 falls to be higher by dVt3(V2)+dVt4(V3) as compared with the auxiliary line (a). The voltage obtained by subtracting Vt1+ΔVt1 from the input voltage $V_{IN}$ gradually increases from the auxiliary line (b) along the auxiliary line (c) from the time point when the input voltage $V_{IN}$ becomes Vt2, to be higher by dVt4(V3). Accordingly, the threshold voltage $V_{TH}$ of the Schmitt circuit of the embodiment shown becomes a voltage at the time point when the voltage V3 intersects the auxiliary line (c), which is slightly higher than the intersection of the auxiliary lines (a) and (b). Since the sources of the first and fourth MOS transistors 1 and 4 are common, the threshold voltage $V_{TH}$ of the Schmitt circuit is not influenced due to offset of the backgate bias voltages ΔVt1 and ΔVt4, as in the same manner as described previously.

When the input voltage $V_{IN}$ becomes the threshold voltage $V_{TH}$ of the Schmitt circuit, the first MOS transistor 1 is turned on and a current flows through the impedance device 5 and the first and second MOS transistors 1 and 2, whereby the voltage V3 further falls and the gate-source voltage of the first MOS transistor 1 increases, with the result that due to a feedback function the voltages V1 and V3 abruptly reach the ground level. On the other hand, since the third MOS transistor 3 is turned off due to the fall of the voltage V1, the voltage V2 becomes a floating state, whereby the same is fixed to a given voltage level.

When the input voltage $V_{IN}$ falls from the sufficiently high voltage and the difference between the input voltage $V_{IN}$ and the voltage V3 become lower than Vt1+ΔVt1, i.e. when the voltage V3 intersects the auxiliary line (c), the first MOS transistor 1 is turned off and the voltage V1 returns to the initial voltage $V_{DD}$ and the voltages V2 and V3 return to the respective loci. When the input voltage $V_{IN}$ becomes lower than Vt2, the voltages V2 and V3 turn to the initial voltage, i.e. V2=$V_{DD}$−(Vt3+ΔVt3), V3=$V_{DD}$−(Vt3+ΔVt3)−(Vt4+ΔVt4).

Even if the input voltage $V_{IN}$ remains zero volt for a long period of time in the above described operation, since the voltage V1 has been raised to the level of the source voltage $V_{DD}$ by means of the impedance device 5, the same cannot reach a floating state, whereby the threshold voltage $V_{TH}$ of the Schmitt circuit is prevented from fluctuating due to an ordinary noise and leakage.

Assuming that referring to FIG. 4 the fluctuation of the backgate bias voltages ΔVt3 and ΔVt4 when the input voltage $V_{IN}=V_{TH}$ are equal to dVt3(V2) and dVt4(V3), respectively, and the auxiliary lines (d) and (e) are the long at the angle of 45° with respect to the abscissa from the intersection of the voltage V3 and the auxiliary line (c), then the threshold voltage $V_{TH}$ of the Schmitt circuit may be expressed by the following equation.

$$V_{TH} = \frac{V_{DD} - (Vt3 + \Delta Vt3) + dVt3(V2) - (Vt4 + \Delta Vt4)}{2} + \frac{+dVt4(V3) + V t2 + (Vt1 + \Delta Vt1) - dVt1(V3)}{2}$$

Since, the first, second, third and fourth transistors 1, 2, 3 and 4 are all formed on the same chip, the threshold voltages Vt1, Vt2, Vt3 and Vt4 of these transistors are all the same and, since the sources of the first and fourth MOS transistors 1 and 4 are common, the backgate bias voltages ΔVt1 and ΔVt4 of the first and fourth MOS transistors 1 and 4 are equal. Accordingly, the threshold voltage $V_{TH}$ of the Schmitt circuit may be expressed by the following equation.

$$V_{TH} = \frac{V_{DD}}{2} - \frac{\Delta Vt3}{2} + \frac{dVt3(V2)}{2} = \frac{V_{DD}}{2} - \frac{\Delta Vt3(V2)}{2}$$

where ΔVt3−dVt3(V2)=ΔVt3(V2) is assumed. However, although fluctuation of the threshold voltage $V_{TH}$ was eliminated in the Schmitt circuit shown in FIG. 3, an influence is caused by the offset ΔVt3(V2) of the threshold voltage $V_{TH}$ due to the backgate bias voltage of the third MOS transistor 3.

Figure 5:
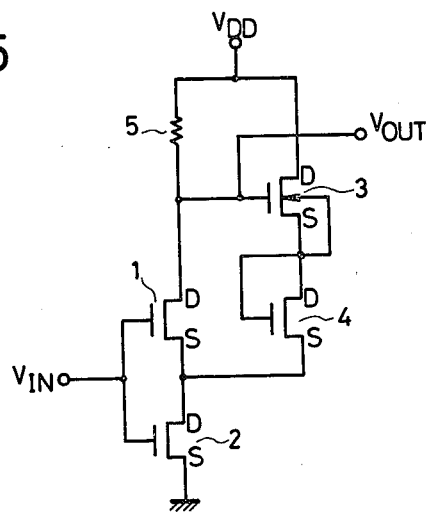
FIG. 5 is a schematic diagram of another embodiment of the present invention.
Figure 7:
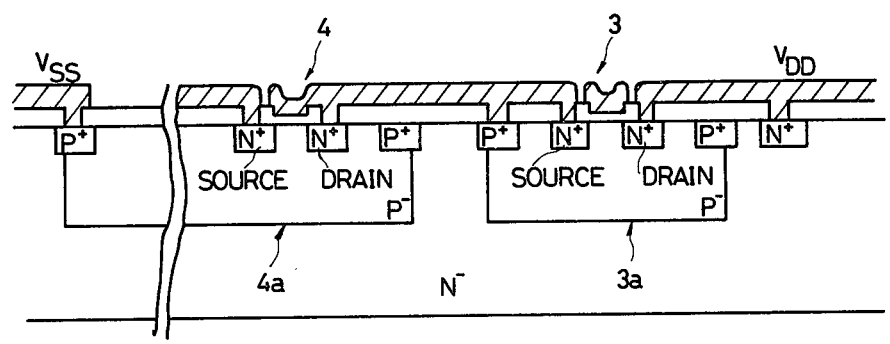
FIG. 7 is a sectional view showing the structure of the FIG. 5 embodiment.

FIG. 5 is a Schmitt circuit which eliminates the backgate bias voltage ΔVt3 and substantially the same as the FIG. 3 diagram except for the following difference. More specifically, in the FIG. 3 diagram the substrates of the MOS transistors 1, 2, 3 and 4 are all connected to the ground, whereas in the FIG. 5 diagram the substrates of the first, second and fourth MOS transistors 1, 2 and 4 are connected to the ground, while the substrate of the third MOS transistor 3 is connected to the source thereof. More specifically, the third MOS transistor 3 is separated from the others in formation thereof in the same chip, wherein the substrate in the separated region is set to be the same potential as that of the source thereof, as shown in FIG. 7. Since the backgate bias voltage is induced by the voltage developed between the source and the substrate, in such a case the offset $\Delta Vt3(V2)$ of the threshold voltage Vt due to the backgate bias voltage becomes zero volt.

Figure 6:
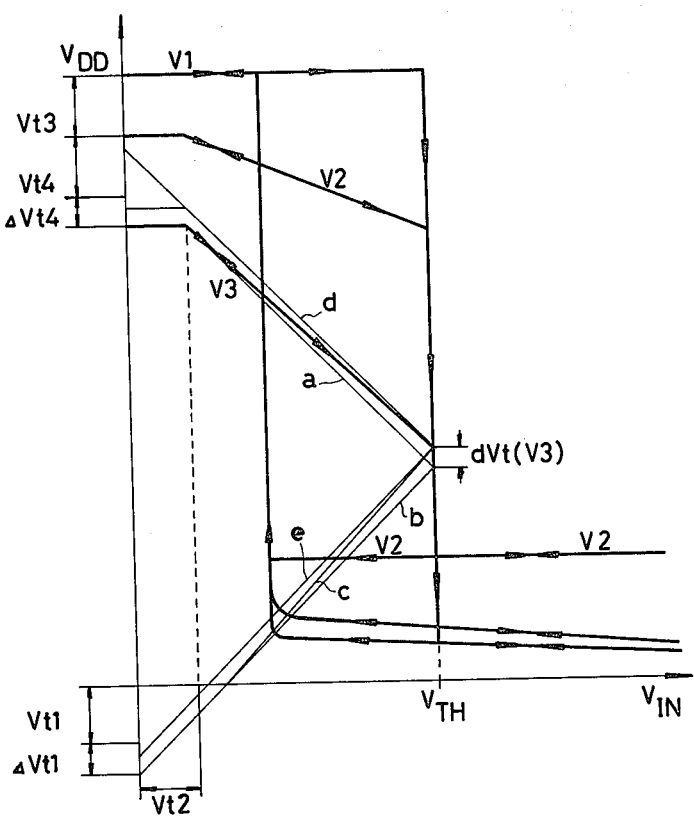
FIG. 6 is a graph depicting the operation of the FIG. 5 embodiment.

FIG. 6 is a graph for depicting the operation of the FIG. 5 diagram and the fundamental operation of the FIG. 5 diagram shown in FIG. 6 is substantially the same as that shown in the FIG. 4 diagram. Referring to FIG. 6, the voltage V2 becomes higher by a value corresponding to a change of the backgate bias voltage $\Delta Vt3$ to zero volt, whereby $V2=V_{DD}-Vt3$ is established. Similarly, the voltage V3 becomes $V3=V_{DD}-Vt3-(Vt4+\Delta Vt4)$. Accordingly, the threshold voltage $V_{TH}$ of the Schmitt circuit may be expressed by the following equation.

$$V_{TH} = \frac{V_{DD} - Vt3 - (Vt4 + \Delta Vt4) + dVt(V3) + Vt2 +}{2} +$$

$$\frac{(Vt1 + \Delta Vt1) - dVt(V3)}{2}$$

Since $Vt1=Vt2=Vt3=Vt4$ and $\Delta Vt1=\Delta Vt4$, $V_{TH}=\frac{1}{2}V_{DD}$ are established, according to the Schmitt circuit shown in FIG. 5, the threshold voltage $V_{TH}$ can be accurately restricted to a half of the source voltage $V_{DD}$, while fluctuation due to a noise and leakage can be fully eliminated.

The impedance device 5 utilized in the Schmitt circuits shown in FIGS. 3 and 5 in accordance with the embodiment of the present invention may comprise a diffusion resistance fabricated through diffusion of an impurity into an integrated circuit chip, a depletion type field effect transistor having no voltage drop due to a threshold voltage thereof, or an MOS transistor of the conductivity type opposite to that of the first to fourth MOS transistors and having the gate connected to the second potential.

FIG. 7 is a sectional view showing one example of a specific structure in accordance with the FIG. 5 embodiment. Referring to FIG. 7, a P-type well 3a is provided for forming only the third MOS transistor 3 therein and is connected to the source thereof. A P-type well 4a is provided for forming the fourth MOS transistor 4 therein and is connected to the voltage source $V_{SS}$ (or the ground potential). Meanwhile, all the N-channel MOS transistors other than the third MOS transistor 3 may be formed using the same P-type well as provided for formation of the fourth MOS transistor 4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A Schmitt circuit, comprising:
   first and second, power supply terminals for receiving first and second voltages;
   an impedance device coupled between said first and second power supply terminals;
   first and second insulated gate field effect transistors having their drain-source current paths coupled in series between said impedance device and said second power supply terminal; and
   third and fourth insulated gate field effect transistors having their drain-source current paths coupled in series between said first power supply terminal and the junction of said first and said second insulated gate field effect transistors said fourth insulated gate field effect transistor having a gate coupled to a drain thereof,
   an input voltage being applied to the gates of said first and second insulated gate field effect transistors, the junction of said impedance device and said first insulated gate field effect transistor being connected to the gate of said third insulated gate field effect transistor, an output voltage being withdrawn therefrom.

2. A Schmitt circuit in accordance with claim 1, wherein
   the substrate of said first, second and fourth insulated gate field effect transistors is connected to said second power supply terminal, and
   the substrate of said third insulated gate field effect transistor is connected to the source thereof.

3. A Schmitt circuit in accordance with claim 1 or 2, wherein
   said impedance device comprises a diffusion resistance fabricated through diffusion of an impurity.

4. A Schmitt circuit in accordance with claim 1 or 2, wherein
   said impedance device comprises a depletion type field effect transistor.

5. A Schmitt circuit in accordance with claim 1 or 2, wherein
   said first to fourth insulated gate field effect transistors are formed in one conductivity type, and
   said impedance device comprises a further insulated gate field effect transistor of the conductivity type opposite to that of said first to fourth insulated gate field effect transistors and having the gate thereof connected to said second power supply terminal.

* * * * *

UNITED STATES PATENT AND TRADEMARK OFFICE
CERTIFICATE OF CORRECTION

PATENT NO. : 4,475,048
DATED : October 2, 1984
INVENTOR(S) : Miyake, et al.

It is certified that error appears in the above-identified patent and that said Letters Patent are hereby corrected as shown below:

On the title page:

In the heading, after "[73] Assignee:", delete "Sanyo Electric Co., Ltd., Tokyo, Japan" and insert therefor --Sanyo Electric Co., Ltd., Moriguchi; Tokyo Sanyo Electric Co., Ltd., Gunma, both of Japan--.

Signed and Sealed this

Eleventh Day of June 1985

[SEAL]

Attest:

DONALD J. QUIGG

Attesting Officer

Acting Commissioner of Patents and Trademarks